United States Patent
Yao et al.

(10) Patent No.: US 9,911,730 B2
(45) Date of Patent: Mar. 6, 2018

(54) TRANSIENT VOLTAGE SUPPRESSOR AND MANUFACTURE METHOD THEREOF

(71) Applicant: Silergy Semiconductor Technology (Hangzhou) LTD, Hangzhou, ZheJiang Province (CN)

(72) Inventors: Fei Yao, Hangzhou (CN); Shijun Wang, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 15/268,773

(22) Filed: Sep. 19, 2016

(65) Prior Publication Data

US 2017/0084601 A1   Mar. 23, 2017

(30) Foreign Application Priority Data

Sep. 22, 2015   (CN) .......................... 2015 1 0607972

(51) Int. Cl.
| | |
|---|---|
| H01L 21/336 | (2006.01) |
| H01L 27/02 | (2006.01) |
| H01L 29/866 | (2006.01) |
| H01L 29/06 | (2006.01) |
| H01L 23/528 | (2006.01) |
| H01L 21/761 | (2006.01) |
| H01L 21/283 | (2006.01) |
| H01L 29/66 | (2006.01) |

(52) U.S. Cl.
CPC ........ *H01L 27/0255* (2013.01); *H01L 21/283* (2013.01); *H01L 21/761* (2013.01); *H01L 23/5283* (2013.01); *H01L 29/0646* (2013.01); *H01L 29/66106* (2013.01); *H01L 29/866* (2013.01)

(58) Field of Classification Search
CPC .............. H01L 27/0255; H01L 29/866; H01L 29/0646; H01L 23/5283; H01L 21/761; H01L 21/283; H01L 29/66106; H01L 27/02; H01L 29/06; H01L 29/66
See application file for complete search history.

(56) References Cited

U.S. PATENT DOCUMENTS

| | | |
|---|---|---|
| 8,982,524 B2 | 3/2015 | Kao et al. |
| 9,246,328 B2 | 1/2016 | Wang et al. |
| 2008/0142899 A1* | 6/2008 | Morris ................... H01L 21/74 257/371 |

(Continued)

*Primary Examiner* — Charles Garber
*Assistant Examiner* — Abdulfattah Mustapha
(74) *Attorney, Agent, or Firm* — Michael C. Stephens, Jr.

(57) ABSTRACT

A transient voltage suppressor can include: a semiconductor substrate; a first buried layer of a first type formed in and on the semiconductor substrate; a second buried layer of a second type formed in a first region of the first buried layer; a first epitaxial region of the second type formed on the second buried layer and a second epitaxial region of the first type formed on a second region of the first buried layer; a first doped region of the first type formed in the first epitaxial region and a second doped region of the second type formed in the second epitaxial region; a conductive channel extending from a surface of the second epitaxial region into the first buried layer; and a first electrode connected to the conductive channel, a second electrode connected to the first doped region, and a third electrode connected to the second doped region.

20 Claims, 8 Drawing Sheets

(56) References Cited

U.S. PATENT DOCUMENTS

| | | | |
|---|---|---|---|
| 2013/0001694 A1* | 1/2013 | Guan | H01L 27/0255 257/355 |
| 2014/0167101 A1* | 6/2014 | Bobde | H01L 27/0259 257/112 |
| 2014/0198418 A1 | 7/2014 | Wang et al. | |
| 2015/0207312 A1 | 7/2015 | Wang et al. | |

* cited by examiner

TRANSIENT VOLTAGE SUPPRESSOR AND MANUFACTURE METHOD THEREOF

RELATED APPLICATIONS

This application claims the benefit of Chinese Patent Application No. 201510607972.1, filed on Sep. 22, 2015, which is incorporated herein by reference in its entirety.

FIELD OF THE INVENTION

The present invention generally relates to the field of semiconductor devices and manufacturing methods, and more particularly to transient voltage suppressors and associated manufacturing methods.

BACKGROUND

Mobile terminal equipment, such as mobile phones and wearable electric equipment, are currently in wide use. The electronic circuitry of mobile terminal equipment are typically operated in a lower operation voltage (e.g., less than about 5V) in order to decrease power losses and increase the service life of the mobile terminal equipment. In view of the lower operation voltage, the withstanding maximum voltage of the electronic circuits is correspondingly lower. Therefore, a transient voltage suppressor (TVS) of a lower breakdown voltage should be employed in order to protect the electronic circuitry.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Semiconductor devices are generally manufactured using two complex manufacturing processes: front-end manufacturing and back-end manufacturing. Front-end manufacturing may involve the formation of a plurality of die on the surface of a semiconductor wafer. Each die on the wafer may contain active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components can be formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist may be removed, leaving behind a patterned layer. Alternatively, some types of materials can be patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface may be used to produce smaller and more densely packed active and passive components. Planarization can be used to remove material from the surface of the wafer and produce a uniformly flat surface. Planarization can involve polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer may be singulated using a laser cutting tool or saw blade. After singulation, the individual die are mounted to a package substrate that includes pins or contact pads for interconnection with other system components. Contact pads formed over the semiconductor die can then be connected to contact pads within the package. The electrical connections can be made with solder bumps, stud bumps, conductive paste, or wire bonds, as a few examples. An encapsulant or other molding material may be deposited over the package to provide physical support and electrical isolation. The finished package can then be inserted into an electrical system and the functionality of the semiconductor device is made available to the other system components.

To protect high speed transmission circuits, a transient voltage suppressor should have a higher response speed in order to provide corresponding protection. Because the response speed is influenced by the intrinsic capacitors, the capacitors should be less than about 0.5 pF in order to improve the response speed. Furthermore, the transient voltage suppressor should also have improved electro-static discharge (ESD) performance. To support multiple high speed transmission lines, a transient voltage suppressor of multiple channels may be integrated into one single die. One common zener diode can be shared by several channels of the transient voltage suppressor such that the number of semiconductor components on the die can be decreased. However, the diodes of the transient voltage suppressor of multiple channels may be electrically connected to each other by bonding wires in the device structure, which can increase the package cost of the chip, and increase the line resistance and parasitic capacitance to decrease the reliability of the semiconductor device. Thus, the bonding wires of the chip of the transient voltage suppressor of multiple channels may be decreased in order to decrease package costs, and to improve reliability.

Figure 1A:
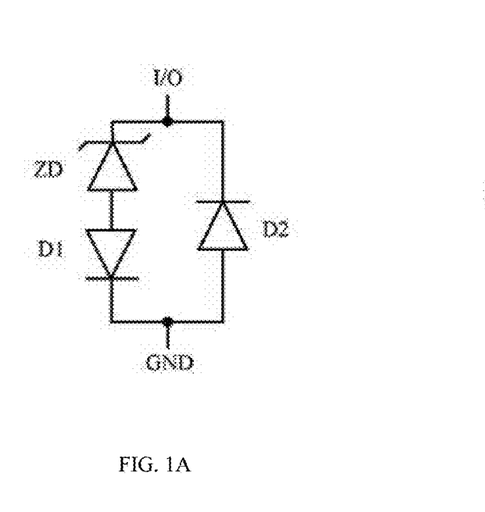
FIGS. 1A-1C show equivalent circuit, equivalent capacitance circuit, and structure diagrams of an example transient voltage suppressor.
Figure 1B:
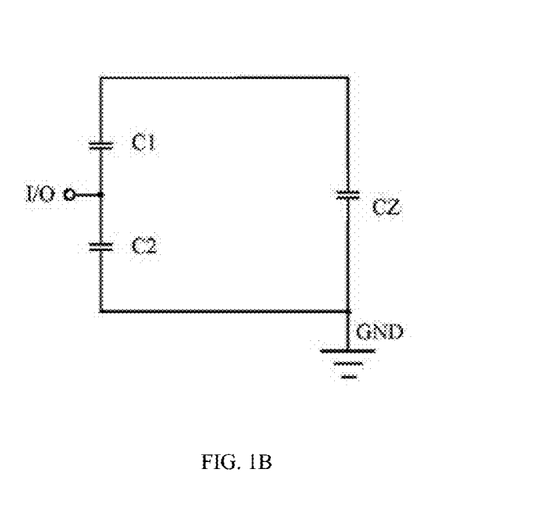
Figure 1C:
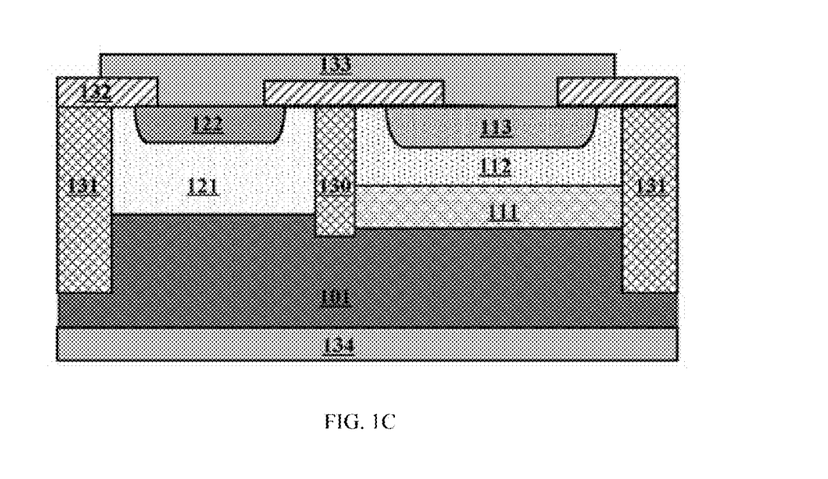

Referring now to FIGS. 1A-1C, shown is equivalent circuit, equivalent capacitance circuit, and structure diagrams of an example transient voltage suppressor. In FIG. 1A, the transient voltage suppressor includes diode D1, diode D2, and zener diode ZD. The anode of zener diode ZD and the anode of diode D1 can connect to each other, the cathode of zener diode ZD can connect to terminal I/O, and the cathode of diode D1 can connect to terminal GND. The cathode of diode D2 can connect to terminal I/O, and the anode of diode D2 can connect to terminal GND. Both zener diode ZD and diode D1 may provide a positive conductive path, and diode D2 can provide a negative conductive path.

As shown in FIG. 1B, diodes D1 and D2, and zener diode ZD are separately equivalent to capacitor C1, C2 and CZ. Capacitor C1 can connect in series with capacitor CZ between terminal I/O and terminal GND, and capacitor C2 can connect between terminal I/O and terminal GND. The total equivalent capacitance between terminal I/O and terminal GND of the transient voltage suppressor may be represented as the formula $C_{I/O\text{-}GND}=C1*CZ/(C1+CZ)+C2$. In view that the capacitance of zener diode ZD is much higher than the capacitance of diodes D1 and D2, and the capacitance of diodes D1 and D2 meets the following relationship, $C1 \approx C2 = C$, the capacitance between terminal I/O and terminal GND can be represented as $C_{I/O\text{-}GND} \approx 2C$. Thus, the equivalent capacitance of the transient voltage suppressor may not be limited by zener diode ZD of a larger capacitance, but can be determined by the capacitance of diodes D1 and D2. The equivalent capacitance of the transient voltage suppressor can be lower when the capacitance of diodes D1 and D2 is lower.

Furthermore, as shown in FIG. 1C, transient voltage suppressor 100 may be formed in a "first" region and a "second" region of N+ type substrate 101. The first and second regions are separated by isolation structure 130 (e.g., a trench isolation structure). In the first region, P type buried layer 111 can be formed in and on N+ type substrate 101, epitaxial region 112 may be formed on P type buried layer 111, and N+ type doped region 113 can be formed in epitaxial layer 112. In the second region, epitaxial region 121 may be formed on N+ type substrate 101, and P+ doped region 122 can be formed in epitaxial layer 121. Electrode 133 of transient voltage suppressor 100 can connect to N+ type doped region 113 and P+ doped region 122 penetrating the opening of insulating interlayer 132. Electrode 134 can connect to N+ type substrate 101.

In this example, epitaxial regions 112 and 121 of the epitaxial semiconductor layer may be separately self-doped as the type different from the buried layer and semiconductor substrate. For example, the type of epitaxial region 112 can be P type, the type of epitaxial region 121 can be N− type, and isolation structure 131 can be a trench isolation structure. The PN junction of zener diode ZD may be formed between N+ type substrate 101 and P type buried layer 111. The PN junction of diode D1 can be formed between epitaxial region 112 and N+ type region 113. The PN junction of diode D2 may be formed between epitaxial region 121 and P+ type region 122. Electrode 133 connected to N+ type doped region 113 and P+ doped region 122 may be configured as terminal GND, and electrode 134 connected to N+ type substrate 101 may be configured as terminal I/O.

In the structure of this particular example transient voltage suppressor, N+ type substrate 101 can be configured as the cathode of zener diode ZD and second electrode 134 may be configured as terminal I/O. Therefore, only one terminal I/O may be provided in one die in view that N+ type substrate 101 is configured as a common structure. However, each channel of the transient voltage suppressor of multiple channels may have a respective terminal I/O as an input and output port. Therefore, the structure of this example transient voltage suppressor may not be applicable to achieve transient voltage suppressor of multiple channels in some cases, and may only adapt to a single channel transient voltage suppressor formed in one die. To form a transient voltage suppressor of multiple channels, bonding wires should be employed in order to electrically connect different dice. The employment of bonding wires among different die may increase package costs and add wire resistance and parasitic capacitance to decrease the reliability of the transient voltage suppressor.

Figure 2:
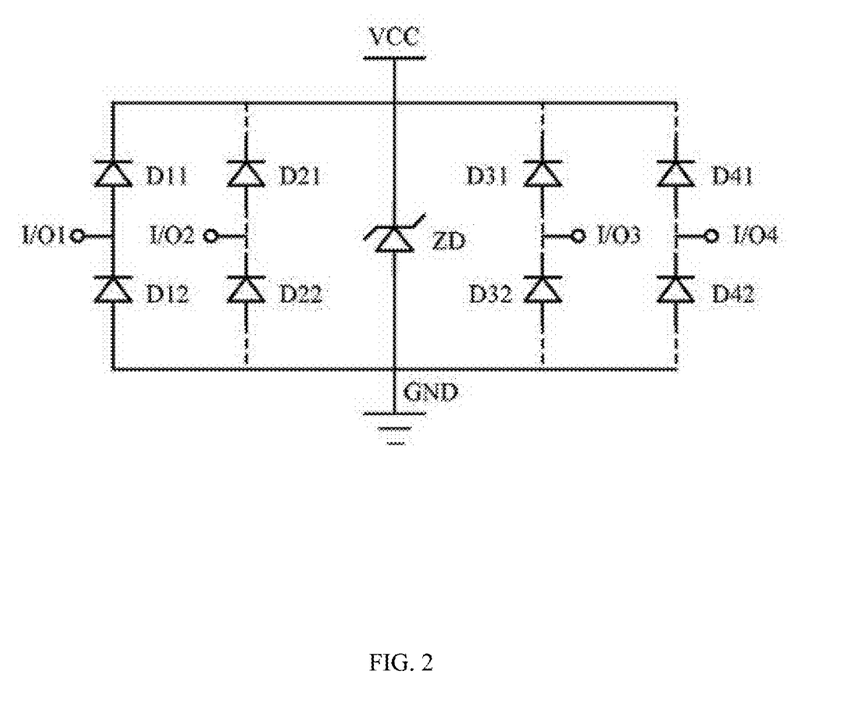
FIG. 2 shows an equivalent circuit diagram of an example transient voltage suppressor of multiple channels.

Referring now to FIG. 2, shown is an equivalent circuit diagram of an example transient voltage suppressor of multiple channels. This particular example transient voltage suppressor array includes four channels and common zener diode ZD. Each channel includes one diode of diodes D11 to D41, and another diode of diodes D12 to D42. For example, in one channel, the cathode of zener diode ZD and the cathode of diode D11 can connect to each other, the anode of zener diode ZD can be coupled to terminal I/O, and the anode of diode D11 can be coupled to terminal GND.

The cathode of diode D12 can be coupled to terminal I/O, and the anode may be coupled to terminal GND. Both zener diode ZD and diode D11 may provide a positive conductive path, and diode D12 can provide a negative conductive path.

In one embodiment, a transient voltage suppressor can include: (i) a semiconductor substrate; (ii) a first buried layer of a first doped type formed in and on the semiconductor substrate; (iii) a second buried layer of a second doped type formed in a first region of the first buried layer; (iv) a first epitaxial region of the second doped type formed on the second buried layer and a second epitaxial region of the first doped type formed on a second region of the first buried layer; (v) a first doped region of the first doped type formed in the first epitaxial region and a second doped region of the second doped type formed in the second epitaxial region; (vi) a conductive channel extending from a surface of the second epitaxial region into the first buried layer; and (vii) a first electrode connected to the conductive channel, a second electrode connected to the first doped region, and a third electrode connected to the second doped region.

In one embodiment, a method of making a transient voltage suppressor, can include: (i) forming a first buried layer in and on a semiconductor substrate; (ii) forming a second buried layer of second doped type in a first region of the first buried layer to expose a surface of a second region of the first buried layer; (iii) forming an epitaxial semiconductor layer on the first and second buried layers comprising a first epitaxial region connected to the second buried layer and a second epitaxial region connected to the first buried layer; (iv) forming a conductive channel extending from a surface of the second epitaxial region into the first buried layer; (v) forming a first doped region of a first doped type in the first epitaxial region; (vi) forming a second doped region of a second doped type in the second epitaxial region; and (vii) forming a first electrode connected to the conductive channel, a second electrode connected to the doped region, and a third electrode connected to second doped region.

Figure 3A:
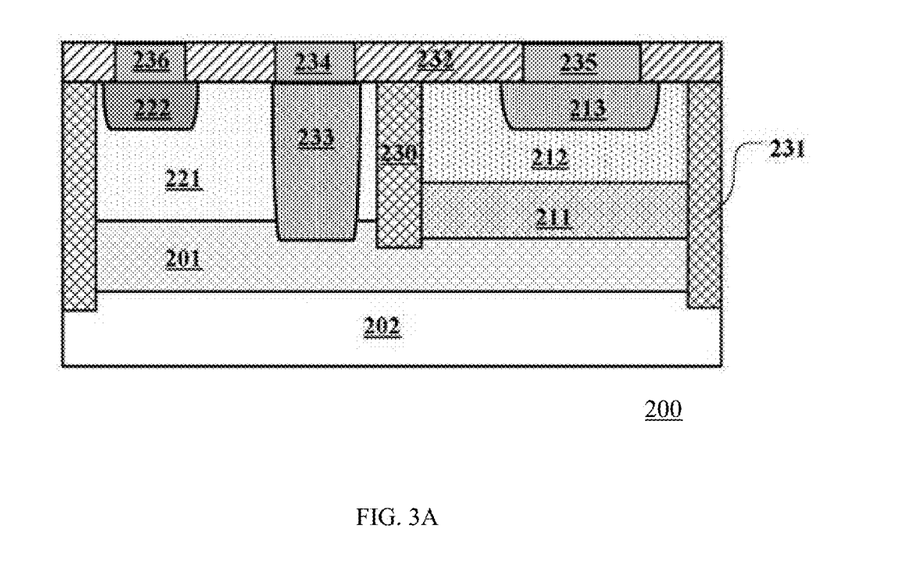
FIGS. 3A and 3B show structure and equivalent circuit diagrams of a first example transient voltage suppressor, in accordance with embodiments of the present invention.
Figure 3B:
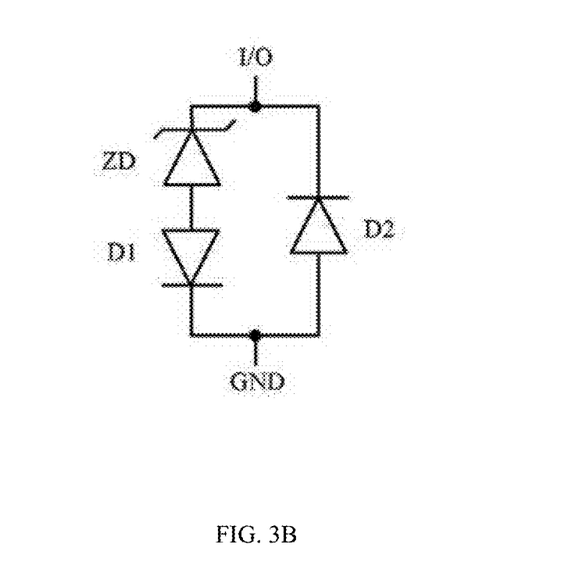

Referring now to FIGS. 3A and 3B, shown are structure and equivalent circuit diagrams of a first example transient voltage suppressor, in accordance with embodiments of the present invention. This particular example transient voltage suppressor is a single channel and one-way device. As shown in FIG. 3A, transient voltage suppressor 200 can be formed in first and second regions of P type substrate 202, where the first and second regions are separated by isolation structure 230. N+ type buried layer 201 can be formed in P type substrate 202. In the first region, P type buried layer 211 may be formed in and on N+ type buried layer 201. Epitaxial region 212 can be formed on P type buried layer 211, and N+ type region 213 may be formed in epitaxial region 212.

The doped density of P type substrate 202 can be less than that of P type buried layer 211. In the second region, epitaxial region 221 may be formed on N+ type buried layer 201, and P+ type region 222 can be formed in epitaxial region 221. In epitaxial region 221, N+ type conductive channel 233 may be formed penetrating through epitaxial region 221 and extending to N+ type buried layer 201. Electrode 234 can connect to N+ type conductive channel 233 through the opening of insulating interlayer 232 and be electrically coupled to N+ type buried layer 201. Electrode 235 can connect to N+ type region 213, and electrode 236 can connect to P+ type region 222.

In FIG. 3A, electrodes 235 and 236 may be separated; however, electrode 235 and electrode 236 can also be electrically connected to each other. In view that electrodes 235 and 236 are arranged on a same surface, electrodes 235 and 236 can be connected to each other by a metal layer in order to decrease the number of bonding wires. In this example, epitaxial regions 212 and 221 of the epitaxial semiconductor layer may be self-doped to be a different doped type than N+ type buried layer 201 and P type substrate 202, respectively. Here, epitaxial region 212 may be doped as P type, and epitaxial region 221 may be doped as N− type.

In FIG. 3A, isolation structure 232 can extend from the surface of the epitaxial semiconductor layer to P type substrate 202 at the sides of transient voltage suppressor 200 in order to isolate transient voltage suppressor 200 from adjacent semiconductor devices. Inside transient voltage suppressor 200, isolation structure 230 can extend from the surface of the epitaxial semiconductor layer to a predetermined depth of N type buried layer 201 in order to isolate the first and second regions. Both isolation structures 230 and 231 can be configured as trench isolation structures.

For example, the doped density of P type substrate 202 may be less than that of P type buried layer 211. In this example transient voltage suppressor of multiple channels, multiple channel units may be formed in and on common P type substrate 202. The PN junction formed between P type substrate 202 and N+ type buried layer 201 can achieve isolation among the different channel units. Advantageously, the light doped P type substrate 202 can decrease the capacitance of the PN junction in order to decrease the parasitic capacitance among channel units. Alternatively, P type substrate 202 can be any doped or undoped semiconductor layer or insulation substrate.

In this particular example, transient voltage suppressor 200 may be formed in and on N+ type buried layer 201. The PN junction of zener diode ZD can be formed between N+ type buried layer 201 and P type buried layer 211. The PN junction of diode D1 may be formed between epitaxial region 212 and N+ type region 213. The PN junction of diode D2 can be formed between epitaxial region 221 and P+ type region 222. Electrode 235 can connect to N+ type region 213, and electrode 236 can connect to P+ type region 222. Both electrodes 235 and 236 may be configured as ground terminal GND, and electrode 234 can connect to N+ buried layer 201, and may be configured as terminal I/O of an input and output port.

When electrodes 235 and 236 can connect together, the equivalent circuit of the above transient voltage suppressor is shown as FIG. 3B, which may be consistent with that of FIG. 1A. The transient voltage suppressor can include diode D1, diode D2, and zener diode ZD. The cathode of diode D2 can be coupled to terminal I/O, and the anode can be coupled to terminal GND. The anodes of zener diode ZD and diode D1 can connect together, the cathode of zener diode ZD can connect to terminal I/O, and the cathode of diode D1 can connect to terminal GND. Both zener diode ZD and diode D1 may provide a positive conductive path, and diode D2 can provide a negative conductive path.

In certain embodiments, the total equivalent capacitance between terminal I/O and terminal GND of transient voltage suppressor 200 can be represented as the formula $C_{I/O\text{-}GND}=C1*CZ/(C1+CZ)+C2$. In view that the capacitance of zener diode ZD is much higher than the capacitance of diodes D1 and D2, and the capacitance of diodes D1 and D2 meets the following relationship, $C1 \approx C2 = C$, the capacitance between terminal I/O and terminal GND can be represented as $C_{I/O\text{-}GND} \approx 2C$.

In the semiconductor structure of this example transient voltage suppressor, N+ type buried layer can be configured as the cathode of zener diode ZD, and electrode 234 may be configured as terminal I/O of an input and output port. This arrangement can provide advantages to form a transient voltage suppressor of multiple channels in view that each channel unit may have separate terminal I/O. In one die, N+ type buried layer 201 can be divided into several separate parts in order to form respective channel units and to provide respective I/O terminals. Zener diode ZD of this example can provide ESD protection. In one alternate example, a punch-through diode can replace zener diode ZD because both punch-through diodes and zener diodes include a plurality of doped regions to form PN junctions, but the doped density of both is different.

As shown in FIGS. 3A and 3B, this example transient voltage suppressor of multiple channels may be integrated in one die. To form the transient voltage suppressor of multiple channels, N+ type buried layer can be divided into multiple separate channel units by isolation structure 231. Then, layers on epitaxial regions 212 and 222 can connect together to electrically connect different channel units to form an array. The semiconductor structure of this example can substantially avoid electrical connections of different channel units outside the die, in order to decrease usage of bonding wires. Therefore, package costs can be decreased, and wire resistance and parasitic capacitance may be decreased to improve the reliability of the semiconductor device.

Figure 4A:
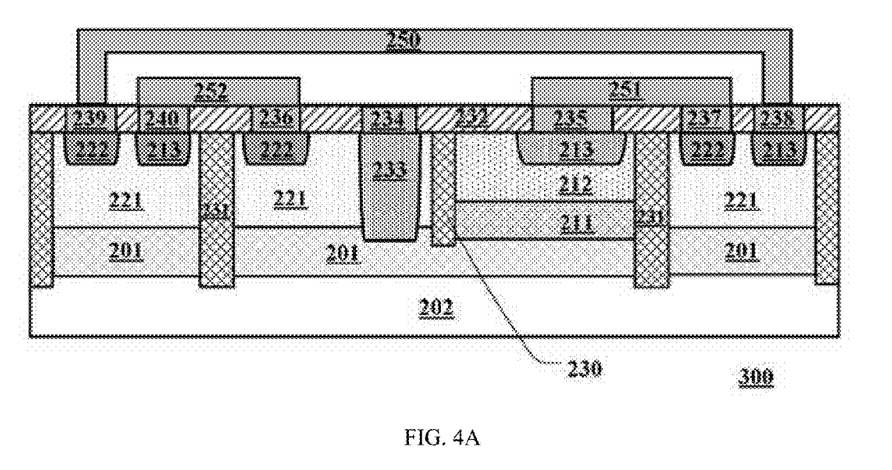
FIGS. 4A and 4B show structure and equivalent circuit diagrams of a second example transient voltage suppressor, in accordance with embodiments of the present invention.
Figure 4B:
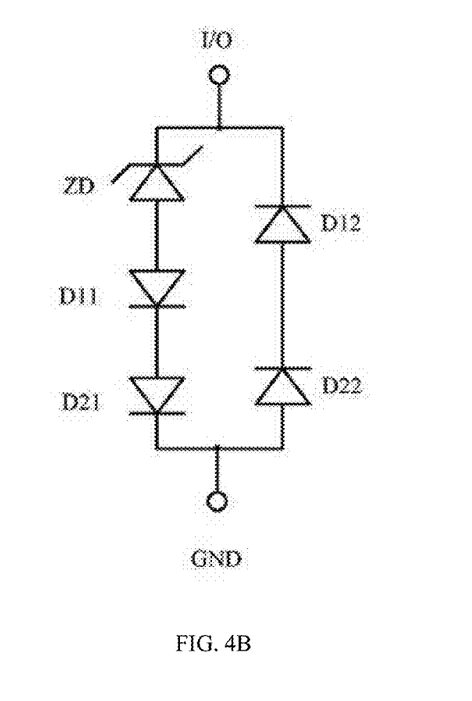

Referring now to FIGS. 4A and 4B, shown are structure and equivalent circuit diagrams of a second example transient voltage suppressor, in accordance with embodiments of the present invention. This particular example transient voltage suppressor is a single channel, one-way semiconductor device. In FIG. 4A, the transient voltage suppressor can be formed in and on the first to fourth regions of P type substrate 202, which is isolated by isolation structures 230 and 231. Isolation structures 230 and 231 can be configured as trench isolation structures. N+ type buried layer can be formed in and on P type substrate 202. In the first region, P type buried layer 211 may be formed in and on N+ type buried layer 201. Epitaxial region 212 can be formed on P type buried layer 211, and N+ type region 213 may be formed in epitaxial region 212. In the second, third, and fourth regions, epitaxial region 221 can be formed on N+ type buried layer 201, and P+ type region 222 may be formed in epitaxial region 221.

In the third and fourth regions, N+ type region 213 can be formed in the third and fourth epitaxial region 221. In epitaxial region 221, N+ type conductive channel 233 may be formed penetrating epitaxial region 221 and extending into N+ type buried layer 201. Electrode 234 can connect to N+ type conductive channel 233 through the opening of insulation interlayer 232. Therefore, electrode 234 can be electrically coupled to N+ type buried layer 201 through N+ type conductive channel 233. Electrodes 235, 236, 237, 238, 239, and 240 can respectively connect to N+ type region 213 of the first region, P+ type region 222 of the second region, P+ type region 222 of the third region, N+ type region 213 of the third region, P+ type region 222 of the fourth region, and N+ type region 213 of the fourth region.

In view that electrodes 234, 235, 236, 237, 238, 239, and 240 may be formed at the same side of the structure, the interconnection can be achieved by one metal layer, in order to decrease the number of bonding wires. Electrodes 235 and 238 can connect together by interconnection wire 251. Electrode 236 and 240 can connect together by interconnection wire 252. Electrodes 238 and 239 can connect together by interconnection wire 250. In FIG. 4A, interconnection wire 250 may be above interconnection wires 251 and 252. However, interconnection wires 250, 251, and 252 can be in a same level by a patterned metal layer, in order to avoid interleaving of interconnection wires.

In this example, epitaxial region 212 of the epitaxial semiconductor layer may have a different doped type from that of buried layer, and epitaxial region 221 of the epitaxial semiconductor layer may have a different doped type from the substrate. For example, the doped type of epitaxial region 212 is P type, and the doped type of epitaxial region 221 is N− type. As shown in FIG. 4A, isolation structure 231 may extend from the surface of the epitaxial semiconductor layer into P type substrate 202 at the sides of transient voltage suppressor 300, in order to isolate transient voltage suppressor 300 from adjacent semiconductor devices. In transient voltage suppressor 300, isolation structure 231 can extend from the surface of the epitaxial semiconductor layer into P type substrate 202 between the first and third regions, and between the second and fourth regions, in order to isolate main elements of transient voltage suppressor from additional diodes. Furthermore, in transient voltage suppressor 300, isolation structure 233 can extend from the surface of the epitaxial semiconductor layer into N+ type buried layer 201 for a predetermined depth isolate the first and second regions.

Transient voltage suppressor 300 can be formed in and on N+ type buried layer 201. In the first region, the PN junction of zener diode ZD may be formed between N+ type buried layer 201 and P type buried layer 211, and the PN junction of diode D11 may be formed between epitaxial region 212 and N+ type region 213. In the second region, the PN junction of diode D12 can be formed between epitaxial region 221 and P+ type region 222. In the third region, the PN junction of diode D21 can be formed between epitaxial region 221 and P+ type region 222. In the fourth region, the PN junction of diode D22 may be formed between epitaxial region 221 and P+ type region 222. Electrode 238 can connect to N+ type region 213 of the third region, and electrode 239 can connect to P+ type region 222 of the fourth region. Electrodes 238 and 239 can connect together electrically to form terminal GND of a ground port. Electrode 234 may be electrically connected to N+ type buried layer 201, and configured as terminal I/O of an input and output port.

The equivalent circuit diagram of the transient voltage suppressor 300 of FIG. 4A is shown as FIG. 4B. The transient voltage suppressor includes diodes D11, D12, D21, and D22, and zener diode ZD. The anode of diode D12 can connect to the cathode of diode D22, cathode of diode D12 can connect to terminal I/O, and the anode of diode D22 can connect to terminal GND. The cathode of diode D11 can connect to the anode of diode D21, and the anode of diode D11 can connect to the anode of zener diode ZD. The cathode of diode D21 can connect to terminal GND, and the cathode of zener diode ZD can connect to terminal I/O. Both diodes D12 and D22 may provide a negative conductive path, and zener diode ZD, diodes D11, and D21 provide a positive conductive path.

Compared to transient voltage suppressor 200 of the first example, in accordance with the present example, the positive conductive path and negative conductive path may include additional diodes. The total equivalent capacitance between terminal I/O and terminal GND of the transient voltage suppressor 200 may be represented as the formula $C_{I/O-GND} = C11*C21*CZ/(CZ*C11+CZ*C21+C11*C21) \pm (C12+C22)/C12*C22$. C11, C12, C21, and C22 respectively represent the equivalent capacitances of the diodes D11, D12, D21, and D22, and CZ represents the equivalent capacitance of zener diode ZD. In view that the capacitance of zener diode ZD is much higher than the capacitance of diodes D11, D12, D21, and D22, and the capacitance meets the following relationship, C11≈C12≈C21≈C22=C, capacitance between terminal I/O and terminal GND may be represented as $C_{I/O-GND}$≈C. As compared to transient voltage suppressor 200 of the first example, the capacitance of transient voltage suppressor of the second example reduces to about one half. When more additional diodes are added, the capacitance can be further decreased.

In the semiconductor structure of the transient voltage suppressor of the present example, N+ type buried layer 201 may be configured as the cathode of zener diode ZD, and electrode 234 may be configured as terminal I/O. This arrangement may provide advantages to form transient voltage suppressor of multiple channels in view that each channel unit may have a respective terminal I/O. In one die, N+ type buried layer 201 may be divided into several separate parts in order to provide a terminal I/O for each channel unit.

As shown in FIGS. 4A and 4B, transient voltage suppressor of multiple channels may be formed in one die. In this example, N+ type buried layer 201 may be divided into multiple separate channel units by isolation structure 231. Also, layers on epitaxial regions 212 and 222 can connect together to electrically connect different channel units to form an array. The semiconductor structure of this example can substantially avoid the electrical connection of different channel units outside of the die, in order to decrease the employment of bonding wires. Therefore, package costs may be decreased, and wire resistance and parasitic capacitance may be decreased in order to improve the reliability of the semiconductor device.

Figure 5A:
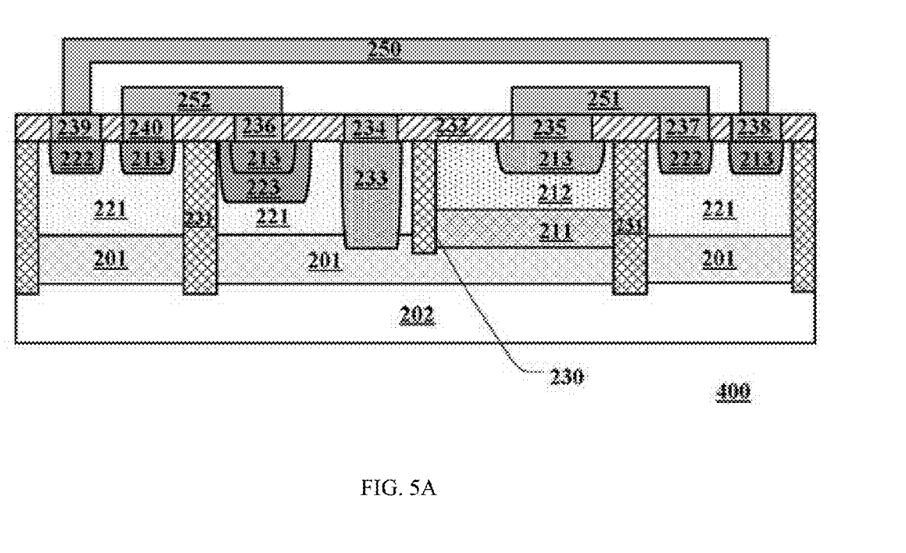
FIGS. 5A and 5B show structure and equivalent circuit diagrams of a third example transient voltage suppressor, in accordance with embodiments of the present invention.
Figure 5B:
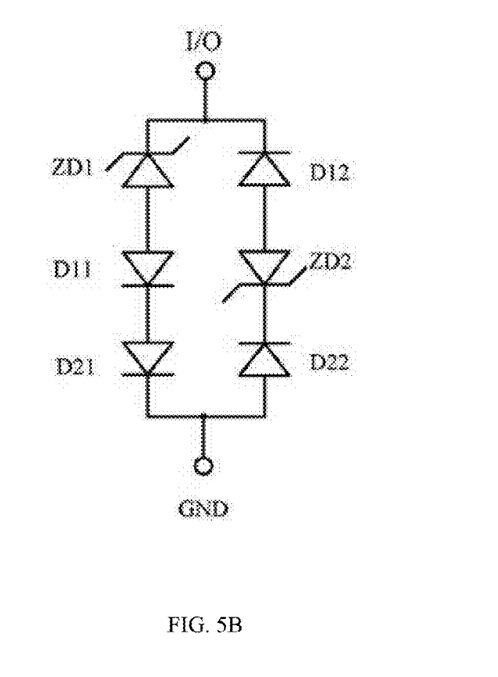

Referring now to FIGS. 5A and 5B, shown are structure and equivalent circuit diagrams of a third example transient voltage suppressor, in accordance with embodiments of the present invention. In this particular example, the transient voltage suppressor may be a single channel, one-way semiconductor device. As shown in FIG. 5A, transient voltage suppressor 400 can be formed in and on the first to fourth regions of P type substrate 202, which may be isolated by isolation structures 230 and 231. Isolation structure 230 and 231 can be configured as trench isolation structures. N+ type buried layer can be formed in and on P type substrate 202. In the first region, P type buried layer 211 may be formed in and on N+ type buried layer 201. Epitaxial region 212 can be formed on P type buried layer 211, and N+ type region 213 may be formed in epitaxial region 212. In the second, third, and fourth regions, epitaxial region 221 can be formed on N+ type buried layer 201. In the second region, P+ type region 223 may be formed in epitaxial region 221, and N+ type region 213 can be formed in P+ type region 223.

In the third and fourth regions, P+ type region 222 and N+ type region 213 can be formed in epitaxial region 221. In epitaxial region 221, N+ type conductive channel 233 may be formed penetrating epitaxial region 221 and extending into N+ type buried layer 201. Electrode 234 can connect to N+ type conductive channel 233 through the opening of insulation interlayer 232. Therefore, electrode 234 can be electrically coupled to N+ type buried layer 201 through N+ type conductive channel 233. Electrodes 235, 236, 237, 238, 239, and 240 can be respectively connected to N+ type region 213 of the first region, N+ type region 213 of the second region, P+ type region 222 of the third region, N+ type region 213 of the third region, P+ type region 222 of the fourth region, and N+ type region 213 of the fourth region.

In view that electrodes 234, 235, 236, 237, 238, 239, and 240 are formed at the same side of the structure, the interconnection may be achieved by one metal layer in order to decrease the number of bonding wires. Electrodes 235 and 238 can connect together by interconnection wire 251. Electrodes 236 and 240 can connect together by interconnection wire 252. Electrodes 238 and 239 can connect together by interconnection wire 250. In FIG. 4A, interconnection wire 250 can be above interconnection wires 251 and 252. However, interconnection wires 250, 251, and 252 can be in a same level by a patterned metal layer in order to avoid the interleaving of interconnection wires.

In this example, epitaxial region 212 of the epitaxial semiconductor layer may have a different doped type from that of buried layer, and epitaxial region 221 of the epitaxial semiconductor layer may have a different doped type from the substrate. For example, the doped type of epitaxial region 212 may be P type, and the doped type of epitaxial region 221 can be N-type. As shown in FIG. 5A, isolation structure 231 may extend from the surface of the epitaxial semiconductor layer into P type substrate 202 at the sides of transient voltage suppressor 400, in order to isolate transient voltage suppressor 400 from adjacent semiconductor devices. In transient voltage suppressor 400, isolation structure 231 can extend from the surface of the epitaxial semiconductor layer into P type substrate 202 between the first and third regions, and between the second and fourth regions, in order to isolate the main elements from additional diodes. Furthermore, in transient voltage suppressor 400, isolation structure 233 may extend from the surface of the epitaxial semiconductor layer into N+ type buried layer 201 for a predetermined depth isolate the first and second regions.

Transient voltage suppressor 400 can be formed in and on N+ type buried layer 201. In the first region, the PN junction of zener diode ZD1 may be formed between N+ type buried layer 201 and P type buried layer 211, and the PN junction of diode D11 can be formed between epitaxial region 212 and N+ type region 213. In the second region, the PN junction of diode D12 may be formed between epitaxial region 221 and P+ type region 223, and the PN junction of zener diode ZD2 can be formed between P+ type region 223 and N+ type region 222. In the third region, the PN junction of diode D21 may be formed between epitaxial region 221 and P+ type region 222. In the fourth region, the PN junction of diode D22 can be formed between epitaxial region 221 and P+ type region 222. Electrode 238 can connect to N+ type region 213 of the third region, and electrode 239 can connect to P+ type region 222 of the fourth region. Electrodes 238 and 239 can connect together electrically to form terminal GND of ground port. Electrode 234 may be electrically connected to N+ type buried layer 201 and configured as an I/O terminal of an input and output port.

The equivalent circuit diagram of the transient voltage suppressor 400 of FIG. 5A is shown as FIG. 5B. The transient voltage suppressor can include diodes D11, D12, D21, and D22, and zener diodes ZD1 and ZD2. The anode of diode D12 can connect to the anode of zener diode ZD2, and cathode of zener diode ZD2 can connect to cathode of diode D22, cathode of diode D12 can connect to terminal I/O, and the anode of diode D22 can connect to terminal GND. The cathode of diode D11 can connect to the anode of diode D21, and the anode of diode D11 can connect to the anode of zener diode ZD. The cathode of diode D21 can connect to terminal GND, and the cathode of zener diode ZD can connect to terminal I/O. Diode D12, zener diode ZD2, and diode D22 may provide a negative conductive path, and zener diode ZD, diode D11, and diode D21 may provide a positive conductive path.

As compared to transient voltage suppressor 200 of the first example, in the present example, the positive conductive path and the negative conductive path can include additional diodes. The total equivalent capacitance between terminal I/O and terminal GND of the transient voltage suppressor 200 may be represented as the formula $C_{I/O\text{-}GND}=C11*C21*CZ1/(CZ1*C11+CZ1*C21+C11*C21)\pm(C12*C22*CZ2)/(CZ2*C12+CZ2*C22+C12*C22)$. C11, C12, C21, and C22 respectively represent the equivalent capacitance of diodes D11, D12, D21, and D22, and CZ1 and CZ2 represent the equivalent capacitance of zener diodes ZD1 and ZD2. In view that the capacitance of zener diodes ZD1 and ZD2 can be much higher than the capacitance of diodes D11, D12, D21, and D22, and the capacitance meets the following relationship, $C11 \approx C12 \approx C21 \approx C22 = C$, the capacitance between terminal I/O and terminal GND may be represented as $C_{I/O\text{-}GND} \approx C$. As compared to transient voltage suppressor 200 of the first example, the capacitance of transient voltage suppressor of the second example may be reduced to about one half. When more additional diodes are added, the capacitance can be further decreased.

In accordance with the semiconductor structure of the transient voltage suppressor of the present example, N+ type buried layer 201 can be configured as the cathode of zener diode ZD1, and electrode 234 may be configured as an I/O terminal. This arrangement can provide advantages to form a transient voltage suppressor of multiple channels in view that each channel unit may have a respective terminal I/O. In one die, N+ type buried layer 201 can be divided into several separate parts to provide an I/O terminal for each channel unit.

As shown in FIGS. 5A and 5B, transient voltage suppressor 400 of multiple channels may be formed in one die. To form a transient voltage suppressor of multiple channels, N+ type buried layer 201 can be divided into multiple separate channel units by isolation structure 231. Also, layers on epitaxial regions 212 and 222 can connect together to electrically connect different channel units to form an array. The semiconductor structure of this example can substantially avoid electrical connection of different channel units outside the die, in order to decrease the employment of bonding wires. Therefore, package costs may be decreased, and wire resistance and parasitic capacitance can be decreased in order to improve the reliability of the semiconductor device.

Figure 6A:
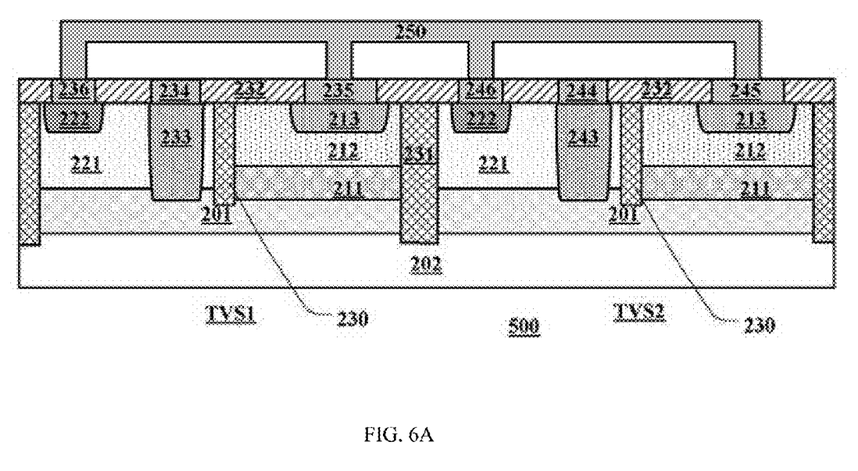
FIGS. 6A and 6B show structure and equivalent circuit diagrams of a fourth example transient voltage suppressor, in accordance with embodiments of the present invention.
Figure 6B:
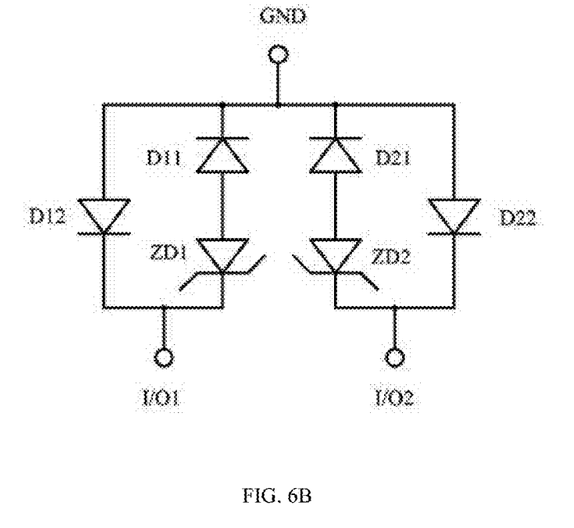

Referring now to FIGS. 6A and 6B, shown are structure and equivalent circuit diagrams of a fourth example transient voltage suppressor, in accordance with embodiments of the present invention. The transient voltage suppressor may be configured as double channels, one-way semiconductor device, or a single channel, bidirectional semiconductor device. Transient voltage suppressor 500 of the fourth example can include two transient voltage suppressors TVS1 and TVS2 according to the first example. As shown in FIG. 6A, transient voltage suppressor 500 can be formed in and on the first to fourth regions of P type substrate 202, which may be isolated by isolation structures 230 and 231.

Isolation structures 230 and 231 can be configured as trench isolation structures. N+ type buried layer 201 can be formed in and on P type substrate 202. In the first region, P type buried layer 211 may be formed in and on N+ type buried layer 201, epitaxial region 212 can be formed on P type buried layer 211, and N+ type region 213 may be formed in epitaxial region 212. In the second region, epitaxial region 221 can be formed on N+ type buried layer 201, and P+ type region 222 may be formed in epitaxial region 221. In epitaxial region 221, N+ type conductive channel 233 can be formed penetrating epitaxial region 221 and extending into N+ type buried layer 201. The third region may have substantially the same structure as the first region, and the fourth region may have substantially the same structure as the second region.

Electrode 234 of transient voltage suppressor 500 can connect to N+ type conductive channel 233 through the opening of insulating interlayer 232, and may be electrically coupled to N+ type buried layer 201. Electrode 235 can connect to N+ type region 213, and electrode 236 can connect to P+ type region 222. Electrode 244 of transient voltage suppressor 500 can connect to N+ type conductive channel 243 through the opening of insulating interlayer 232 and electrically coupled to N+ type buried layer 201. Electrode 245 can connect to N+ type region 213 of the third region, and electrode 246 can connect to P+ type region 222 of the fourth region. Electrodes 234, 235, 236, 244, 245, and 246 may be formed on the same side of the semiconductor structure, and therefore can be formed by one metal layer in order to achieve interconnection therebetween to decrease the number of bonding wires.

In this example, epitaxial regions 212 and 221 of epitaxial semiconductor layer may be self-doped to be different doped type from N+ type buried layer 201 and P type substrate 202, respectively. Here, epitaxial region 212 may be doped as P type, and epitaxial region 221 can be doped as N− type. As shown in FIG. 6A, isolation structure 232 may extend from the surface of the epitaxial semiconductor layer to P type substrate 202 at the sides of transient voltage suppressor 500, in order to isolate transient voltage suppressor 500 from adjacent semiconductor devices. Inside transient voltage suppressor 500, isolation structure 230 can extend from the surface of the epitaxial semiconductor layer to a predetermined depth of N type buried layer 201, in order to isolate the first region and the second region. Also, isolation structure 230 may be configured to isolate the third and fourth regions, and the first and third regions.

In this example structure, transient voltage suppressor 500 can be formed in and on N+ type buried layer 201. In the first region, PN junction of zener diode ZD1 may be formed between N+ type buried layer 201 and P type buried layer 211. The PN junction of diode D11 can be formed between epitaxial region 212 and N+ type region 213. In the second region, the PN junction of diode D12 may be formed between epitaxial region 221 and P+ type region 222. In the third region, the PN junction of zener diode ZD2 can be formed between N+ type buried layer 201 and P type buried layer 211. The PN junction of diode D21 may be formed between first epitaxial region 212 and N+ type region 213. In the fourth region, the PN junction of diode D22 can be formed between epitaxial region 221 and P+ type region 222. Electrodes 235, 236, 245, and 246 can connect together by interconnection wire 250, which may be configured as terminal GND for ground port. In the second region, electrode 234 can be electrically connected to N+ type buried layer 201, and may be configured as terminal I/O1 of TVS1. In the fourth region, electrode 244 can be electrically connected to N+ type buried layer 201 and may be configured as terminal I/O2 of TVS2.

When electrodes 235, 236, 245, and 246 are connected together, the equivalent circuit of the above transient voltage suppressor is shown in FIG. 6B. The transient voltage suppressor can include diodes D11, D12, D21, and D22, and zener diodes ZD1 and ZD2. The cathode of diode D12 may be coupled to terminal I/O1, and the anode can be coupled to terminal GND. The anodes of zener diode ZD1 and diode D11 can connect together, and the cathode of zener diode ZD1 can connect to terminal I/O1 and the cathode of diode D11 can connect to terminal GND. The cathode of diode D22 may be coupled to terminal I/O2, and the anode can be coupled to terminal GND. The anodes of zener diode ZD2 and diode D21 can connect together, the cathode of zener diode ZD2 can connect to terminal I/O2, and the cathode of diode D21 can connect to terminal GND.

In one example, transient voltage suppressor 500 may be configured as a double channel, one-way semiconductor device. For example, electrode 234 can be configured as terminal I/O1, electrode 244 may be configured as terminal T/O2, and interconnection lead 250 can be coupled to ground. In TVS1, zener diode ZD1 and diode D11 may be configured to provide a positive conductive path, and diode D12 may be configured to provide a negative conductive path. In TVS2, zener diode ZD2 and diode D21 can be configured to provide a positive conductive path, and diode D22 can be configured to provide a negative conductive path.

In another example, transient voltage suppressor 500 may be configured as a single channel, bidirectional semiconductor device. For example, electrode 234 can be configured as terminal I/O1, electrode 244 may be configured as terminal T/O2, and interconnection lead 250 can be configured to achieve connectivity inside the die, and may not be coupled to ground. Zener diode ZD1, diode D11, and diode D11 may be configured to provide a positive conductive path, and zener diode ZD2, diode D21, and diode D12 can be configured to provide a negative conductive path.

Figure 7A:
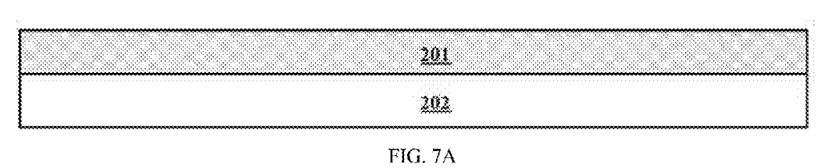
FIGS. 7A-7G show cross-sectional views of the semiconductor structure of each step of an example manufacture method of a transient voltage suppressor, in accordance with embodiments of the present invention.

Referring now to FIGS. 7A-7G, shown are cross-sectional views of the semiconductor structure of each step of an example manufacture method of a transient voltage suppressor, in accordance with embodiments of the present invention. This manufacture method can be configured to form the transient voltage suppressor of the fourth example. As shown in FIG. 7A, N+ type buried layer 201 may be formed in and on P type substrate 202 by an ion implantation and drive-in process. For example, P type substrate 202 can be configured as single crystal silicon substrate, and the doped density may be about 1e15 atoms/cm³. The doped density of N+ type buried layer 201 can be about 1e16-1e20 atoms/cm³, such as about 1e19 atoms/cm³. To form a P type substrate layer or region, a P type dopant (e.g., B, etc.) can be doped in semiconductor layer and region. To form an N type substrate layer or region, an N type dopant (e.g., P, As, etc.) may be doped in the semiconductor layer and region. Doped density and depth may be controlled by controlling the parameters of the ion implantation, such as implantation energy and dose. As such, P type buried layer 211 can be formed in and on the first and second regions of N+ type buried layer 201.

In this step, a photoresist layer may be formed on N+ type buried layer 201, and then the photoresist layer can be etched by a lithography process to form a mask including openings to expose part of N+ type buried layer 201. Ions may be implanted through the openings of the mask by an ion implantation and drive-in process to form P type buried layer 211 on the exposed surface of N+ type buried layer 201. P type buried layer 211 can extend from the surface to the inside of N+ type buried layer 201. The doped density of P type buried layer 211 can be about 1e16-1e20 atoms/cm³. After the ion implantation process, the photoresist layer may be removed by ashing or dissolving in a dissolvent process.

The PN junction of zener diode ZD1 and the PN junction of zener diode ZD2 can be formed between P type buried layer 211 and N+ type buried layer 201. The breakdown voltage of zener diodes ZD1 and ZD2 can be controlled by modulating the doped density of P type buried layer 211 and N+ type buried layer 201.

Figure 7B:
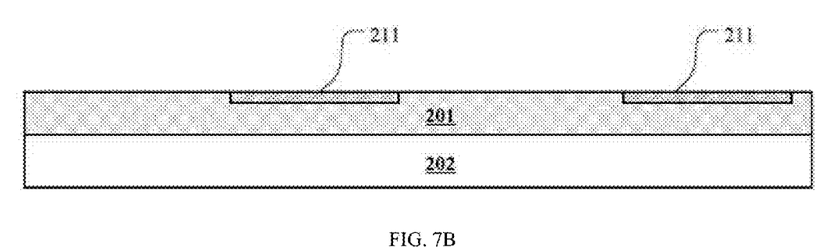

An epitaxial semiconductor layer may be formed on the surface of N+ type buried layer 201 including P type buried layer 211 by a depositing process (e.g., EBM, CVD, ALD, sputtering processes, etc.). The thickness of the epitaxial semiconductor layer may be from about 3 to about 10 um. The epitaxial semiconductor layer can be configured as an intrinsic layer, and can include an N type dopant (e.g., P, As, etc.) of a predetermined density. In one example, the intrinsic doped density of the epitaxial semiconductor layer may be about 1e11-1e14 atoms/cm. Due to the auto-doping effect, during the growth of the epitaxial semiconductor layer, dopants of the substrate may enter into epitaxial semiconductor layer to change the conductive polarity of the epitaxial semiconductor layer.

Figure 7C:
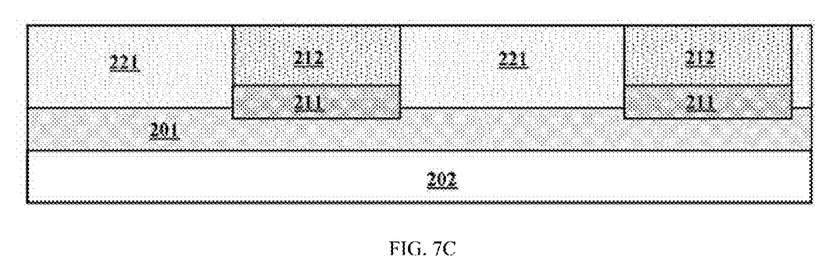
Figure 7D:
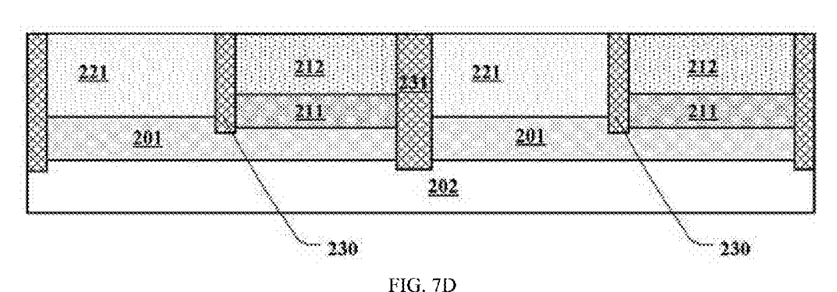

In this example, by modulating the intrinsic doped density of the epitaxial semiconductor layer, the portion of the epitaxial semiconductor layer connected to P type buried layer 211 can be configured as epitaxial region 212, and the portion connected to N+ type buried layer 201 may be configured as epitaxial region 221, as shown in FIG. 7C. In view of the auto doping of P type buried layer 211 to the epitaxial semiconductor layer, epitaxial region 212 may be doped as a P-type layer. In view of the auto doping of N+ type buried layer 201 to epitaxial semiconductor layer, epitaxial region 221 may be doped as N-type layer. Further, isolation structures 230 and 231 configured to define the first to fourth regions can be formed as shown in FIG. 7D. Isolation structures 230 and 231 can be trench isolation structures.

At the sides of transient voltage suppressor 500, isolation structure 231 may extend from the surface of epitaxial semiconductor layer into N+ type buried layer 201, in order to isolate transient voltage suppressor 500 from adjacent semiconductor devices. Inside transient voltage suppressor 500, between the first and second regions, and between the third and fourth regions, isolation structure 230 can extend from the surface of the epitaxial semiconductor layer into a predetermined depth of P type substrate 202. Between the first and third regions, isolation 231 may extend from the surface of epitaxial semiconductor layer into a predetermined depth of P type substrate 202.

In this example, at least one side of one portion of isolation structure 230 can connect to P type buried layer 211 and epitaxial region 212, and the other side can connect to epitaxial region 221 to isolate P type buried layer 211 from epitaxial region 221 to avoid the occurrence of breakdown. In an alternate example, if the distance between active region of transistor Q1 and active region of transistor Q2 is large enough to avoid the occurrence of breakdown, isolation 230 between transistors Q1 and Q2 can be omitted.

In this step, photoresist layer may be formed on N+ type buried layer 201, and then the photoresist layer can be etched by lithography process to form mask including openings to expose portions of epitaxial region 221. Ions may be implanted through the openings of the mask by an ion implantation and drive-in process to form isolation structure 230 and 231. After the ion implantation process, the photoresist layer can be removed by ashing or dissolving in dissolvent process. In an alternate example, isolation structures 230 and 231 may be configured as trench isolation structures, and can be formed in any steps after the formation of epitaxial region 221. For example, a shallow trench can initially be formed by etching, and then can be filled by an insulation material.

Figure 7E:
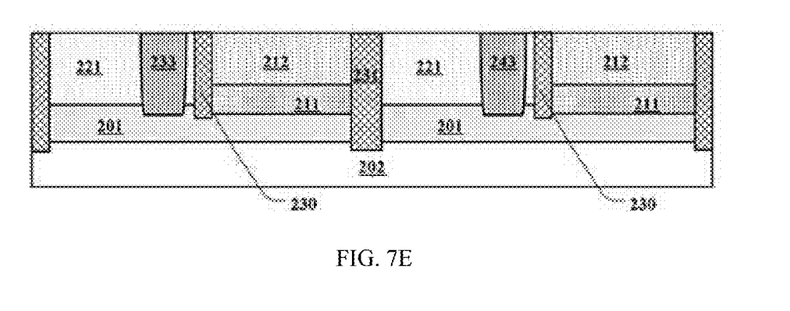

In the second and fourth regions, N+ type conductive channels 233 and 243 extending from the surface of epitaxial region 220 into N+ type buried layer 201 may be formed as shown in FIG. 7E. In this step, photoresist layer may be formed on N+ type buried layer 201, and then the photoresist layer can be etched by a lithography process to form a mask including openings to expose portions of epitaxial region 221. Ions may be implanted through the openings of the mask by an ion implantation and drive-in process to form N+ type conductive channels 233 and 243. After the ion implantation process, the photoresist layer can be removed by ashing, or dissolving in dissolvent process.

Figure 7F:
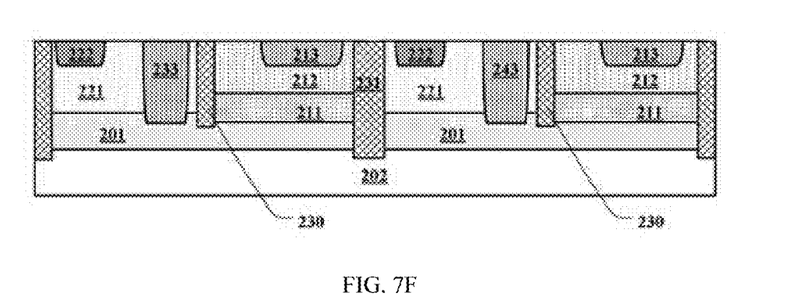

N+ type region 213 may be formed in epitaxial region 212, and P+ type region 222 can be formed in epitaxial region 221 as shown in FIG. 7F. In this step, a photoresist layer may be formed on N+ type buried layer 201, and then the photoresist layer can be etched by a lithography process to form mask including openings to expose portions of epitaxial region 212. Ions may be implanted through the openings of the mask by an ion implantation and drive-in process to form N+ type region 213 in epitaxial region 212 extending from the surface of epitaxial region 212 into epitaxial region 212. For example, the doped density of N+ type region 213 can be in the range of about 1e17-1e21 atoms/cm$^3$. After the ion implantation process, the photoresist layer may be removed by ashing or dissolving in dissolvent process.

A photoresist layer can be formed on N+ type buried layer 201, and then the photoresist layer may be etched by a lithography process to form a mask including openings to expose portions of epitaxial region 221. Ions can be implanted through the openings of the mask by an ion implantation and drive-in process to form P+ type region 222 in epitaxial region 221 extending from the surface of epitaxial region 221 into epitaxial region 221. For example, the doped density of P+ type region 222 can be in the range of about 1e15-5e18 atoms/cm$^3$. After the ion implantation process, the photoresist layer may be removed by ashing or dissolving in a dissolvent process.

Insulation interlayer 232 formed by silicon oxide can be deposited on the surface of the semiconductor structure shown in FIG. 7F. By lithography and etching processes, openings of insulation interlayer 232 may be formed to expose N+ type region 213 and P+ type region 222. By a depositing process, electrodes 234, 235, 236, 244, 245, and 246 can be formed in the openings of insulation interlayer 232. Interconnection lead 250 can be formed on insulation interlayer 232. For example, the electrodes and interconnection leads can be formed by gold metal, silver metal, or copper metal.

Figure 7G:
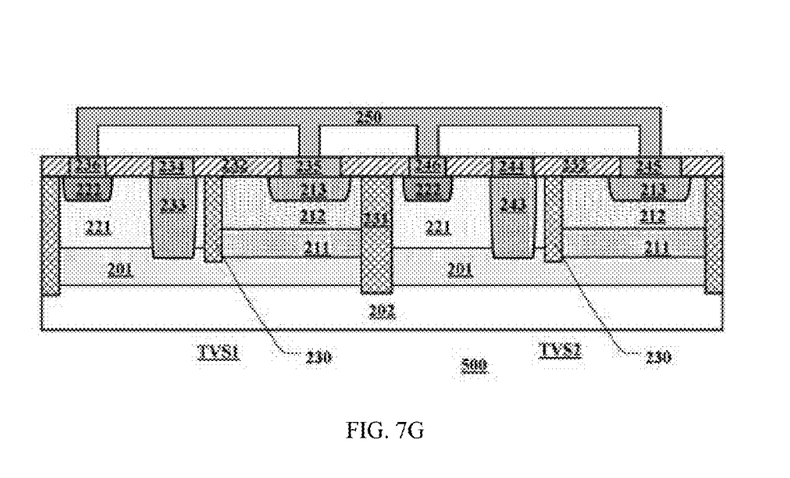

Electrodes 234, 235, 236, 244, 245, and 246 can be formed in a same level of the semiconductor structure of FIG. 7G, which can be formed by one metal layer to achieve interconnectivity among the electrodes, in order to decrease the number of bonding wires. In the first to fourth regions, electrodes 235, 236, 245, and 246 can connect together by interconnection lead 250, which may be configured as terminal I/O coupled to ground. In the second region, electrode 234 and N+ buried layer 201 can be electrically connected together, which can be configured as terminal I/O1 of input and output port of TVS1. In the fourth region, electrode 244 and N+ buried layer 201 can be electrically connected together, which may be configured as terminal I/O2 of input and output port of TVS2.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A transient voltage suppressor, comprising:
   a) a semiconductor substrate;
   b) a first buried layer of a first doped type formed in and on said semiconductor substrate;
   c) a second buried layer of a second doped type formed in a first region of said first buried layer;
   d) a first epitaxial region of said second doped type formed on said second buried layer and a second epitaxial region of said first doped type formed on a second region of said first buried layer;
   e) a first doped region of said first doped type formed in said first epitaxial region and a second doped region of said second doped type formed in said second epitaxial region;
   f) a conductive channel extending from a surface of said second epitaxial region into said first buried layer; and
   g) a first electrode connected to said conductive channel, a second electrode connected to said first doped region, and a third electrode connected to said second doped region.

2. The transient voltage suppressor of claim 1, wherein:
   a) a PN junction of a zener diode or a punch-through diode is formed between said first buried layer and said second buried layer;
   b) a PN junction of a first diode is formed between said first epitaxial region and said first doped region; and
   c) a PN junction of a second diode is formed between second epitaxial region and said second doped region.

3. The transient voltage suppressor of claim 2, wherein said semiconductor substrate is doped as said second doped type and a doped density is lighter than that of said second buried layer.

4. The transient voltage suppressor of claim 2, wherein said conductive channel is configured as a doped region of said first doped type.

5. The transient voltage suppressor of claim 2, wherein said first and second epitaxial regions are formed by a same epitaxial semiconductor layer by respectively auto-doping said first and second buried layers.

6. The transient voltage suppressor of claim 2, further comprising a first isolation structure extending from a surface of said first and second epitaxial regions into said semiconductor substrate to isolate said transient voltage suppressor from adjacent semiconductor devices.

7. The transient voltage suppressor of claim 6, further comprising a second isolation structure extending from a surface of said first and second epitaxial regions into said first buried layer to isolate said first and second epitaxial regions from said second buried layer.

8. The transient voltage suppressor of claim 6, wherein said first isolation is configured to:
   a) define a third region adjacent to said first region; and
   b) a fourth region adjacent to said second region of said first buried layer, wherein said second epitaxial region is on said first buried layer in said third and fourth regions.

9. The transient voltage suppressor of claim 8, wherein said third region comprises:

a) a third doped region of said first doped type in said second epitaxial region; and
b) a fourth doped region of said second doped type in said second epitaxial region, wherein said fourth region comprises a fifth doped region of said first doped type and a sixth doped region of said second doped type.

10. The transient voltage suppressor of claim 9, wherein:
a) said first doped region and said fourth doped region are electrically connected by a first interconnection structure;
b) said second doped region and said fifth doped region are electrically connected by a second interconnection structure; and
c) said third doped region and said sixth doped region are electrically connected by a third interconnection structure.

11. The transient voltage suppressor of claim 9, wherein said second region comprises a seventh doped region of said second doped type in said second doped region.

12. The transient voltage suppressor of claim 11, wherein:
a) said first doped region and said fourth doped region are electrically connected by a first interconnection structure;
b) said seventh doped region and said fifth doped region are electrically connected by a second interconnection structure; and
c) said third doped region and said sixth doped region are electrically connected by a third interconnection structure.

13. The transient voltage suppressor of claim 6, wherein:
a) said first isolation structure is configured to define adjacent third and fourth regions of said first buried layer, and said fourth region is adjacent to said first region;
b) in said third region, said second buried layer is on said first buried layer, and said first epitaxial region is on said second buried layer; and
c) in said fourth region, said second epitaxial region is on said first buried layer.

14. The transient voltage suppressor of claim 13, wherein:
a) said third region comprises a third doped region of said first doped type in said first epitaxial region;
b) said fourth region comprises a fourth doped region of said second doped type in said second epitaxial region; and
c) said fourth region comprises another conductive channel extending from a surface of said second epitaxial region into said first buried layer.

15. The transient voltage suppressor of claim 14, wherein said first, second, third, and fourth doped regions are electrically connected by said first interconnection structure.

16. The transient voltage suppressor of claim 1, wherein said first doped type is one of N type and P type, and said second doped type is a remaining type of said N type and said P type.

17. A method of making a transient voltage suppressor, the method comprising:
a) forming a first buried layer in and on a semiconductor substrate;
b) forming a second buried layer of second doped type in a first region of said first buried layer to expose a surface of a second region of said first buried layer;
c) forming an epitaxial semiconductor layer on said first and second buried layers comprising a first epitaxial region connected to said second buried layer and a second epitaxial region connected to said first buried layer;
d) forming a conductive channel extending from a surface of said second epitaxial region into said first buried layer;
e) forming a first doped region of a first doped type in said first epitaxial region;
f) forming a second doped region of a second doped type in said second epitaxial region; and
g) forming a first electrode connected to said conductive channel, a second electrode connected to said doped region, and a third electrode connected to second doped region.

18. The method of claim 17, further comprising forming a first isolation structure extending from a surface of said first and second epitaxial regions into said semiconductor substrate to isolate said transient voltage suppressor from adjacent semiconductor devices.

19. The method of claim 18, further comprising forming a second isolation structure extending from a surface of said first and second epitaxial regions into said first buried layer to isolate said second epitaxial region from said first epitaxial region and said second buried layer.

20. The method of claim 18, further comprising forming additional elements and interconnection structure, wherein said additional elements comprises at least two doped regions and at least two electrodes connected to said doped regions, and wherein said interconnection structure is configured to connect said first to third electrodes to at least portion of said at least two electrodes.

* * * * *